(12) United States Patent
Ito et al.

(10) Patent No.: US 8,661,657 B2
(45) Date of Patent: Mar. 4, 2014

(54) BACK-UP PIN DEVICE AND BACK-UP PIN PLACING DEVICE

(75) Inventors: Hidetoshi Ito, Chiryu (JP); Fumitaka Maeda, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 221 days.

(21) Appl. No.: 13/089,659

(22) Filed: Apr. 19, 2011

(65) Prior Publication Data

US 2011/0268346 A1  Nov. 3, 2011

(30) Foreign Application Priority Data

Apr. 28, 2010 (JP) ................. 2010-103216

(51) Int. Cl.
*B23P 19/00* (2006.01)
*H01R 43/00* (2006.01)

(52) U.S. Cl.
USPC ............. 29/749; 29/739; 29/740; 29/759; 29/760

(58) Field of Classification Search
USPC .......... 29/749, 703, 739, 740, 743, 759, 760, 29/784, 833, 834
See application file for complete search history.

(56) References Cited

U.S. PATENT DOCUMENTS

2004/0255455 A1* 12/2004 Yu et al. ................. 29/837

FOREIGN PATENT DOCUMENTS

| JP | 2004-3535973 | * | 5/2003 | ............ H05K 13/04 |
| JP | 2003-283197 | | 10/2003 | |
| JP | 2009-032825 | * | 7/2007 | ............ H05K 13/04 |
| JP | 2009-32825 | | 2/2009 | |

* cited by examiner

*Primary Examiner* — Thiem Phan
(74) *Attorney, Agent, or Firm* — Oblon, Spivak, McClelland, Maier & Neustadt, L.L.P.

(57) ABSTRACT

A plurality of indicated back-up pin devices are detachably placed on a back-up plate provided on a component mounting apparatus, to a plurality of indicated positions of the back-up plate to support a board from an under surface thereof, to which already mounted components have been mounted, when another components are to be mounted on an upper surface of the board. The back-up pin device comprises a base portion detachably placed on the back-up plate, at least one support pin erected upright on the base portion to support the board by contacting an upper end thereof with an under surface of the board and at least one of an identification mark for identifying the type of the back-up pin device and a position mark as a reference to determine a position of the base portion on the back-up plate, which is provided on the base portion.

8 Claims, 7 Drawing Sheets

BACK-UP PIN DEVICE AND BACK-UP PIN PLACING DEVICE

INCORPORATION BY REFERENCE

This application claims priority under 35 U.S.C. Sec. 119 to No. 2010-103216 filed in Japan on Apr. 28, 2010, the entire content of which is herein incorporated by reference.

BACKGROUND OF THE INVENTION

1. Field of the Invention

This invention relates to a back-up pin device and back-up pin placing method and device, wherein a plurality of back-up pin devices are detachably positioned to and arranged on respective indicated positions on a back-up plate equipped on a component mounting apparatus and supports a board from the under surface thereof, on which components have been already mounted when another components are to be mounted on the upper surface of the board.

2. Discussion of the Related Art

As an example of the back-up pin placing device, JP2003-283197 A discloses a back-up pin placing device (board back-up device) for a component mounting apparatus (apparatus for mounting components on a board surface) which includes a back-up pin device (support pin) on which a support pin is erected upright at a base portion (seat portion) made of a magnetic material, a stocker (support pin supply box) on which the support pins are arranged in parallel with one another, and a back-up plate (support frame) made of a magnet material on which the support pins are mounted. According to this back-up pin placing device, the back-up pin device is sucked and moved from the stocker onto the back-up plate by a component suction nozzle for freely positioning the same.

Further, JP2009-32825 A discloses a back-up pin placing device (back-up plate forming device) for a component mounting apparatus which includes a plurality of base portions (small sized plate) on which a plurality of support pins (back-up pins) are detachably set and at the same time into which different ID (identification) information are respectively recorded, a set up device for setting the plurality of support pins to the base portion and a back-up plate (mother plate) having a plurality of plate placing portions, in which respective position information corresponding to the ID information of the base portions are recorded.

According to this back-up pin placing device, the back-up pin device (base portions to which the support pins are set) is firstly formed by setting the plurality of support pins according to the set position coordinate data onto the base portions by holding and moving the support pins by the use of a special purpose chucking and setting machine. Then, the back-up pin device is sucked and positioned to the plate placing portion on the back-up plate based on the ID information and the position information by a special purpose suction nozzle of the machine. And then, judgment is made whether or not the back-up pin device is positioned accurately to the proper plate placing portion by obtaining and confirming the ID information and the position information by the use of a board camera.

Recently, in order to increase the component mounting density on the board, the components are becoming to be mounted on both upper and lower side surfaces of the board. When the components are to be mounted on the upper surface of the board, after other components already have been mounted on the under surface thereof, the support pins have to be placed to the assigned portions avoiding the interference with the already mounted other components. However, according to the back-up pin placing device disclosed in JP2003-283197 A, the back-up pin device, on which one support pin is erected upright has to be placed or arranged one by one at a position on the back-up plate, where the already mounted components on the under surface of the board have been avoided. This has been increasing the man-hour for placing the back-up pin device and reducing the component mounting efficiency. Further, according to the back-up pin placing device disclosed in JP2009-32825 A, it is required that the back-up pin device is formed by placing the support pins one by one at the base portions where the already mounted components on the under surface of the board are avoided and further, it is necessary to place the back-up pin device at a predetermined position of the plate placing portion on the back-up plate, which further increases the man-hour for arrangement and further reduces the mounting efficiency as well.

SUMMARY OF THE INVENTION

The present invention has been made considering the above state of art and it is an object of the present invention to provide a back-up pin device and a back-up pin placing method and device which can easily position a support pin to an indicated position on the back-up plate.

The feature of the present invention regarding a back-up pin device is that a plurality of indicated back-up pin devices of different types are detachably placed to indicated positions of a back-up plate equipped to a component mounting apparatus to support a board from an under surface thereof, to which components have already been mounted, when another components are to be mounted on an upper surface of the board. The back-up pin device comprises a base portion detachably placed on the back-up plate, at least one support pin erected upright on the base portion to support the board by contacting an upper end thereof with the under surface of the board and at least one of an identification mark for identifying a type of the back-up pin device and a position mark as a reference to determine a position of the base portion when the base portion is placed on the back-up plate, which is provided at the base portion.

With this construction, the randomly chosen number of support pins are erected upright at the base portion of the back-up pin device, and at least one of the identification mark and the position mark is provided thereon. Therefore, by preparing back-up pin devices of a plural of different types, indicated back-up pin devices can be efficiently placed on the indicated positions on the back-up plate according to the marks so as to let the support pins avoid the already mounted components on the under surface of the board. Further, since the support pins are erected upright on the base portion in advance, there is no need to perform the work for placing the support pins on the base portion, which was necessary for the conventional back-up pin device. Accordingly, the efficiency of positioning work for the back-up pin devices can be highly improved. The man-hour for arrangement of the back-up pin devices can be reduced, and thereby the mounting efficiency of the mounting components to the board can be greatly improved.

The feature of the present invention regarding a back-up pin placing method for placing indicated above-mentioned back-up pin devices of different types on a back-up plate provided beneath the board to support the board from an under surface thereof when components are mounted on an upper surface of the board by a component mounting apparatus is that the back-up pin placing method comprises repeated steps of taking an image of at least one of an identification mark and a position mark provided on the back-up pin device placed at a stocker, picking up the indicated back-up pin device necessary for supporting the board on which the components are to be mounted from the stocker and detachably placing the back-up pin device to the indicated placing position on the back-up plate based on information regarding the type of back-up pin device or information regarding the placing position on the back-up plate.

With this construction, the randomly chosen number of support pins are erected upright at the base portion of the back-up pin device and at least one of the identification mark and the position mark is provided thereon. Therefore, by preparing back-up pin devices of a plural of different types, the indicated back-up pin devices can be efficiently placed on the indicated positions on the back-up plate according to the mark so as to let the support pins avoid the already mounted components on the under surface of the board. Further, since the back-up pin device is formed by erecting at least one support pin on the base portion in advance, there is no need to perform the work for placing the support pins on the base portion, which was necessary for the conventional back-up pin device, and thereby the efficiency of positioning work for the back-up pin devices can be highly improved. Accordingly, the man-hour for arrangement of the back-up pin devices can be reduced and the mounting efficiency of the mounting components to the board can be greatly improved.

The feature of the present invention regarding a back-up pin placing device for placing back-up pins on a back-up plate provided beneath the board to support the board from an under surface thereof when components are mounted on an upper surface of the board by a component mounting apparatus is that the back-up pin placing device comprises the above mentioned back-up pin devices of different types, a stocker capable of placing the back-up pin devices of different types, an image taking means capable of taking an image of at least one of an identification mark and a position mark of the back-up pin device placed in the stocker, a pickup means capable of picking up the back-up pin device placed in the stocker or the back-up pin device placed on the back-up plate, a transport means capable of moving the pickup means between the stocker and the back-up plate, a memory means for memorizing the information on the images of marks inputted from the image taking means or the information on the types of the back-up pin devices and the indicated positions of the indicated back-up pin devices on the back-up plate, which are necessary for supporting the boards while the components are mounted thereon and a control means for controlling the operation of the image taking means, pickup means and the transport means, wherein the control means drives the transport means and the pickup means to pick up the indicated back-up pin device from the stocker and to detachably place the picked up back-up pin device to the predetermined position on the back-up plate.

With this construction, since the randomly chosen number of support pins are erected upright on the base portions of the back-up pin devices of different types and at the same time at least one of the identification mark and the position mark is provided thereon respectively, according to the mark the back-up pin placing device can select an indicated back-up pin device among the plurality of back-up pin devices of different types stored in the stocker and can efficiently place the indicated back-up pin device on the indicated position on the back-up plate so as to let the support pins avoid the already mounted components on the under surface of the board. Further, since the back-up pin devices are formed by erecting the support pins on the base portion in advance, the back-up pin placing device can only be so controlled as to place the indicated back-up pin devices to the indicated positions on the back-up plate without performing the work for placing the support pins on the base portion of the back-up pin device, which was necessary for the conventional back-up pin device. Accordingly, the structure of the back-up pin placing device can be simplified to greatly reduce the cost therefor.

BRIEF EXPLANATION OF ATTACHED DRAWINGS

The foregoing and additional features and characteristics of the present invention will become more apparent from the following detailed description considered with the reference to the accompanying drawings, wherein.

PREFERRED EMBODIMENT OF THE INVENTION

Figure 1:
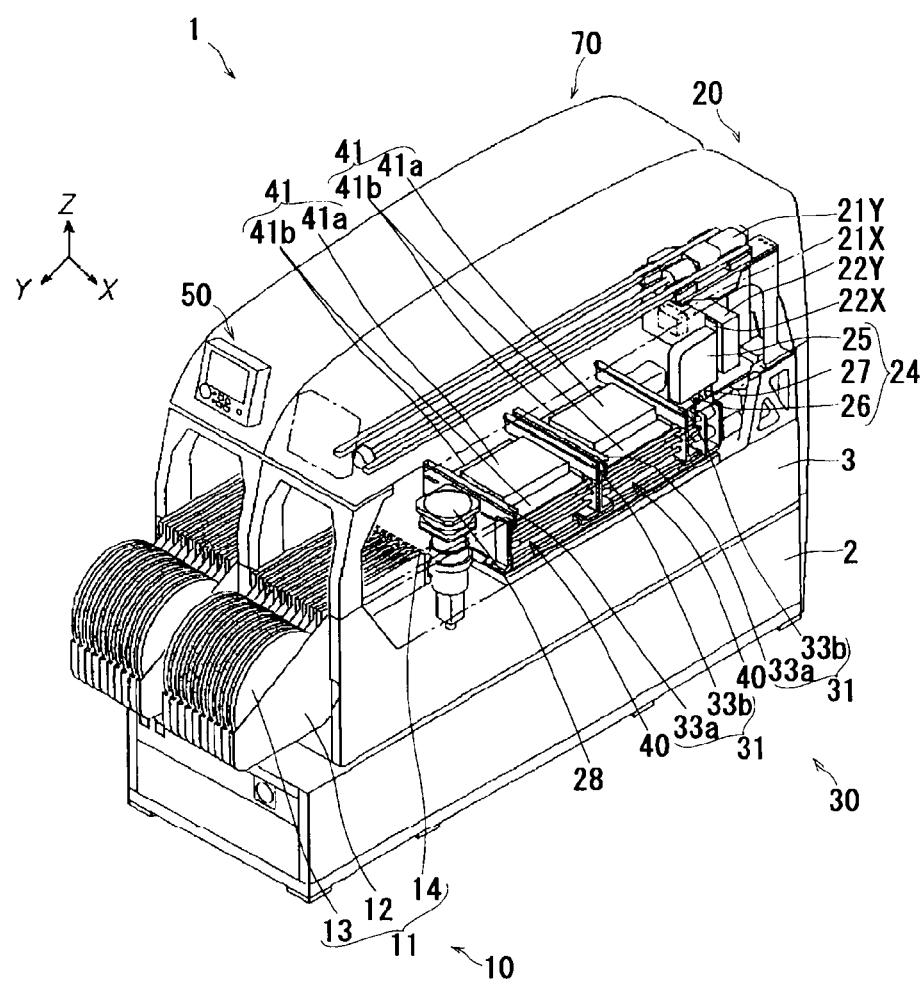
FIG. 1 is a perspective view showing a component mounting apparatus equipped with a back-up pin placing device according to an embodiment of the present invention.

The component mounting apparatus equipped with a back-up pin placing device according to the embodiment of the invention will be explained hereinafter. As shown in FIG. 1, the component mounting apparatus 1 includes a component supply device 10, a component transfer device 20, a board transport device 30, a back-up device 40 and a control device 50. It should be noted here that FIG. 1 indicates that two component mounting apparatuses 1 are placed in parallel with each other and installed on one single bed 2, but more than two component mounting apparatuses 1 may be arranged in parallel with one another in practical component mounting line. In the explanation hereinafter, the direction, in which the two component mounting apparatuses 1 are arranged, i.e., the direction of board transporting, is presumed to be the X-axis direction, the direction intersecting the X-axis direction with a right angle in a horizontal plane is presumed to be the Y-axis direction and the direction intersecting with a right angle to the X-axis and Y-axis directions is presumed to be the Z-axis direction.

The component supply device 10 is of a cassette type formed by placing a plurality of feeders 11 in parallel on a base frame 3. Each feeder 11 includes a main body 12 detachably attached to the base frame 3, a supply reel 13 detachably installed to the rear portion of the main body 12 and a component supply portion 14 provided at a tip end of the main body 12. On each supply reel 13 a carrier tape is wound to be held thereon. The carrier tape are formed with cavities accommodating components or parts with a predetermined pitch with one another and covered with a cover tape. According to the component supply device 10 thus structured, the carrier tape is pulled out from the supply reel 13 with a predetermined pitch length by a sprocket (not shown) and the component accommodated in the cavity is fed to the component supply portion 14 one by one after the cover tape is removed from the cavity.

Figure 2:
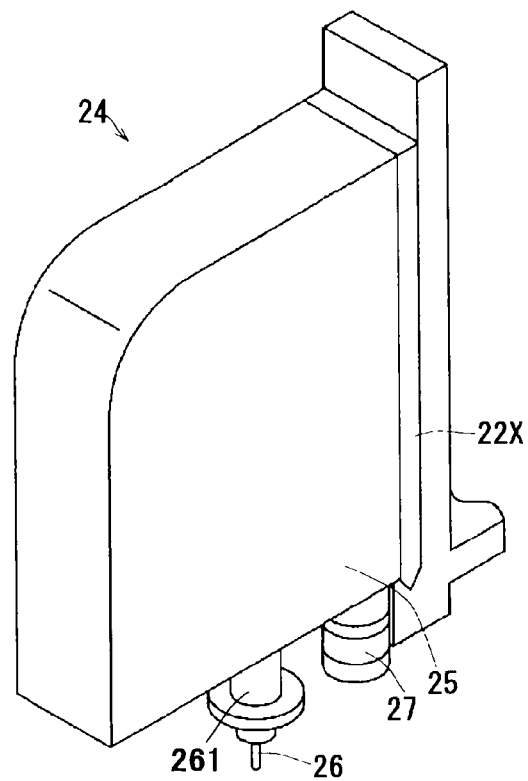
FIG. 2 is a perspective view showing a main part of a component transfer device of the component mounting apparatus shown in FIG. 1.

The component transfer device 20 is of XY robot type provided on an upper portion of the base frame 3 and placed above the component supply device 10 and the board transport device 30. The component transfer device 20 includes a Y-axis slider 22Y movable in the Y-axis direction driven by a Y-axis servo motor 21Y and an X-axis slider 22X movable in the X-axis direction driven by an X-axis servo motor 22X. The X-axis slider 22X is mounted on the Y-axis slider 22Y and guided in an X-axis direction thereon. As shown in FIGS. 1 and 2, the X-axis slider 22X is provided with a component mounting head 24 which is adapted for mounting the component onto the board.

The component mounting head 24 is provided with a first nozzle holder portion 261 which extends downwardly from a head main body 25, a component suction nozzle 26 provided at a lower end portion of the first nozzle holder portion 261 for holding a component by suction and a board image taking camera 27 such as a CCD camera extending downwardly from the head main body 25 adapted for taking the image of the board to confirm a position thereof. The component suction nozzle 26 is attached to the lower end of the first nozzle holder portion 261 which is mounted on the head main body 25 and is vertically movable in the Z-axis direction and at the same time is rotatable around the Z-axis driven by a servo motor (not shown). The component suction nozzle 26 is to be connected to a vacuum pump (not shown) for sucking a component at the tip end of the nozzle. A component image taking camera 28 such as a CCD camera is disposed between the component supply device 10 and the board transport device 30 for taking an image of a component in order to confirm a held position of the component sucked and held by the component suction nozzle 26.

The component mounting head 24 has been moved to the rear side of the base frame 3 by the Y-axis slider 22Y and the X-axis slider 22X of the component transfer device 20 during the stand-by condition as shown in FIG. 1. However, the head 24 will be moved towards the front side of the base frame 3 when a component is to be mounted onto the board. Then, the component is sucked and held by the component suction nozzle 26 and then is mounted onto the board transported by the board transport device 30.

Figure 3:
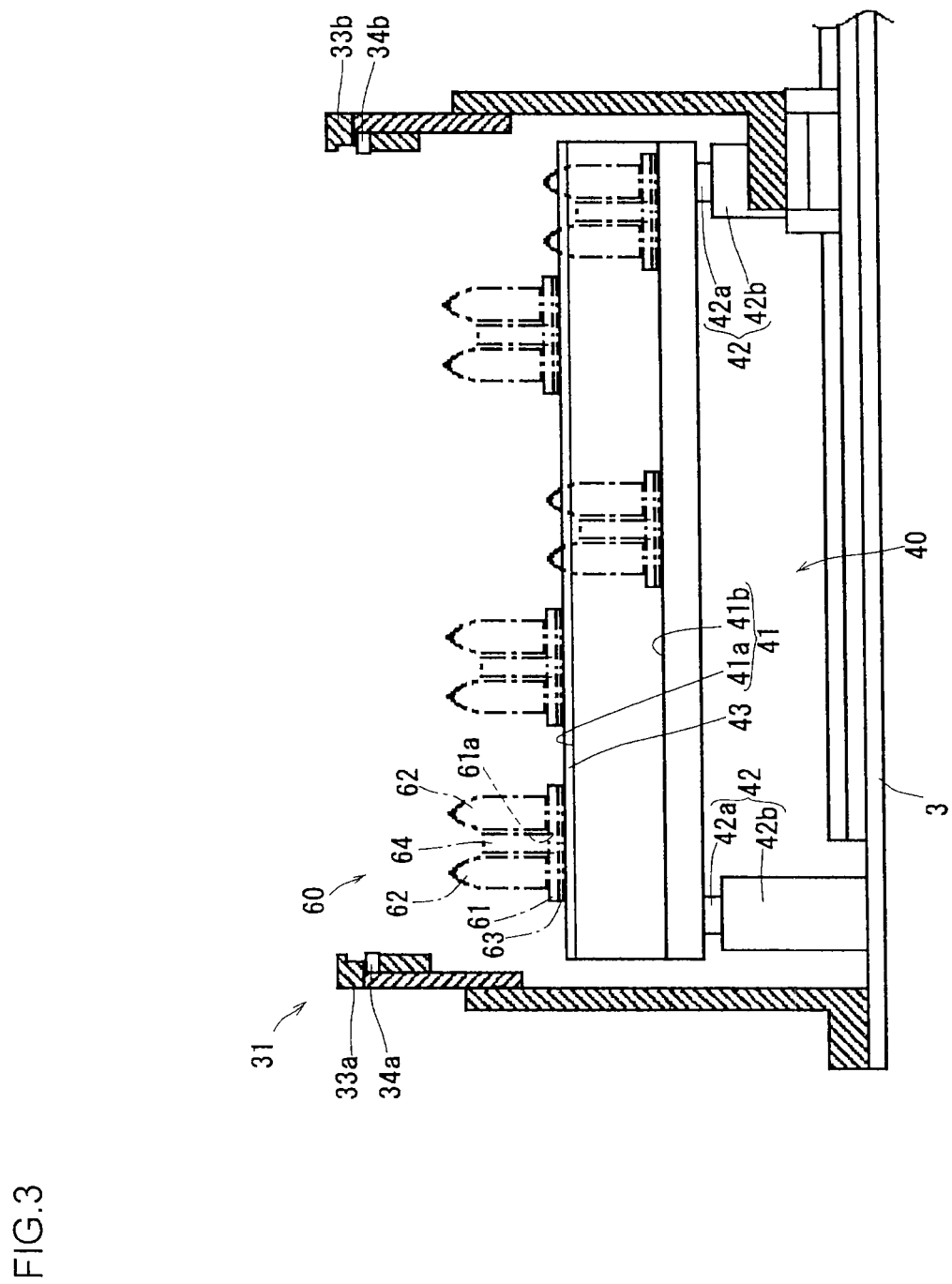
FIG. 3 is a side view showing a main part of a board transport device and a back-up device of the component mounting apparatus in FIG. 1.
Figure 4:
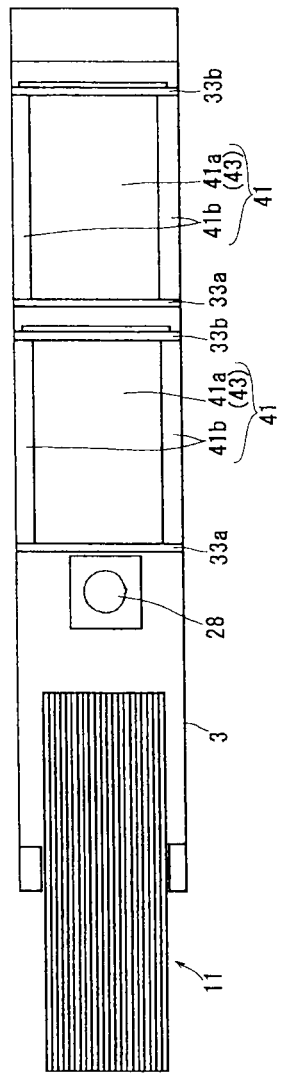
FIG. 4 is a plane view showing the main part of a component supply device, the board transport device and the back-up device of the component mounting apparatus in FIG. 1.

The board transport device 30 is of a so-called double conveyer type structured by mounting two transport devices 31 on the base frame 3 in two parallel lines and two back-up devices 40 on the base frame 3 in parallel with each other below the transport devices 31 respectively. As shown in FIGS. 1, 3 and 4, the transport device 31 is provided with a pair of guide rails 33a and 33b extending in the X-axis direction, each opposing in parallel on the base frame 3 and a pair of conveyer belts 34a and 34b provided in parallel with each other below the guide rails 33a and 33b, respectively.

The back-up device 40 is structured by providing a back-up plate 41 and a lifting and lowering device 42 placed one above the other on the base frame 3 below the board transport device 30. The back-up device 40 is provided with a back-up pin device 60 supporting the board from the lower surface thereof. The board is transported and positioned to a predetermined position by the board transport device 30. The back-up plate 41 is provided with a rectangular plate shaped placing portion 41a for placing the back-up pin device 60 thereon and a rectangular plate shaped stocker 41b for stocking the back-up pin device 60 thereon. The stocker 41b is integrally formed with the placing portion 41a at both sides thereof, having the height lower than that of the placing portion 41a. As explained, since the stocker 41b is provided on the back-up plate 41, the size of back-up pin placing device 70 (later explained in detail) can be minimized. It should be noted here that the stocker 41b may be structured to be fixed at both sides of the component image taking camera 28, instead of being placed on the back-up plate 41. This will make the usable surface area on the back-up plate 41 so wide that a larger board can be supported thereby. The lifting and lowering device 42 is provided with four rods 42a to which four corners of the back-up plate 41 are attached respectively and four cylinders 42b for vertically advancing and retreating the corresponding rods 42a.

According to thus structured board transport device 30, the board supported by the conveyer belts 34a and 34b is guided by the guiderails 33a and 33b and is moved in the X-axis direction to a predetermined mounting position (position above the back-up plate 41) by the conveyer belts 34a and 34b. Then, the back-up plate 41 is lifted by the lifting and lowering device 42 and the board is pushed up from the conveyer belts 34a and 34b by the back-up pin device 60 placed on the placing portion 41a of the back-up plate 41 and is set and fixed to the predetermined position by being pressed to pressing portions provided at upper ends of the guide rails 33a and 33b, each projecting inwardly.

Here, in the back-up device 40, the component transfer device 20 is used when the back-up pin device 60 is moved from the stocker 41b to the placing portion 41a of the back-up plate 41 for the arrangement or moved from the placing portion 41a to the stocker 41b for stocking. In other words, the component transfer device 20 is used for both as a component transporting means and as a back-up pin device transporting means. Accordingly, the back-up pin placing device 70 according to this embodiment is formed by the back-up device 40 and the component transfer device 20.

Figure 5A:
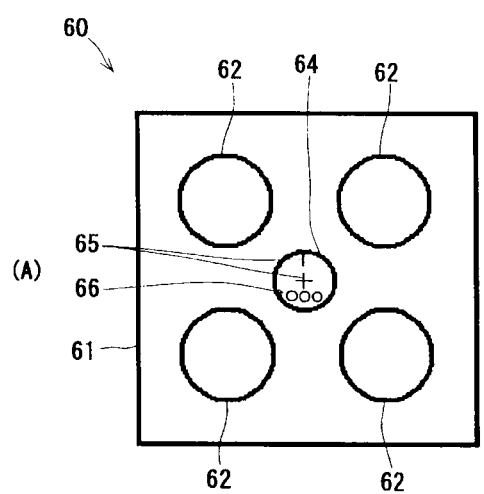
FIG. 5(A) is a plane view of a back-up pin device according to an embodiment of the present invention and FIG. 5(B) is a side view of the back-up pin device according to the embodiment of the present invention.
Figure 5B:
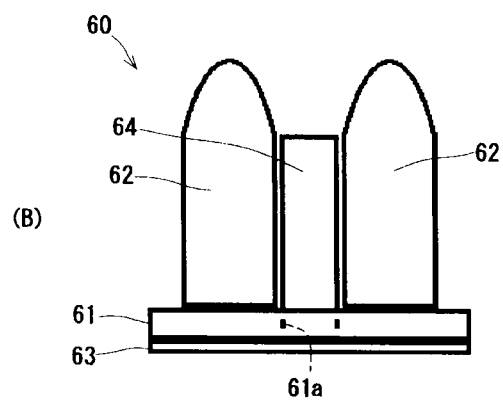

As shown in FIGS. 3 and 5, the back-up pin device 60 is provided with a base portion 61 detachably placed on the placing portion 41a of the back-up plate 41 and a plurality of (in this embodiment, four) support pins 62 erected upright on the base portion 61 to support the board by contacting the upper portion with the under surface of the board. The number of support pins can be randomly chosen including one. Further, the back-up pin device 60 includes a slide preventing member 63 adhered to a surface of the base portion 61 to be placed to the placing portion 41a and a support column 64 erected upright on the base portion 61 to be sucked and picked up at the upper end thereof. An identification mark 65, which identifies the type of the back-up pin device 60 and a position mark 66 as a reference mark for determining the position where the base portion 61 is placed relative to the placing portion 41a are provided on the base portion 61 by stamping or printing at the upper end surface of the support column 64. It is noted that a portion for example the corner portion of the base portion 61 can be used as the position mark 66.

According to this embodiment, since the randomly chosen number of support pins 62 are erected upright at the base portion 61 of the back-up pin device 60 and the identification mark 65 and the position mark 66 are provided thereon, by preparing back-up pin devices 60 of different types, the indicated back-up pin devices 60 are efficiently placed on the indicated positions on the back-up plate 41 according to the marks 65 and 66 so as to let the support pins 62 avoid the already mounted components on the under surface of the board. The indicated back-up pin devices 60 and the indicated positions on the back-up plate 41 to which the indicated back-up pin devices 60 are placed are determined so that a plurality of indicated back-up pin devices 60 of different types are placed to the indicated positions of a back-up plate 41 equipped to a component mounting apparatus 1 to support a corresponding board from an under surface thereof so as to let the support pins 62 avoid the already mounted components on the under surface when another components are mounted on an upper surface of the board. The indicated back-up pin devices 60 and the indicated positions on the back-up plate 41 determined as mentioned above corresponding to a type of a board are memorized in a memory device 53 described later.

Further, since the support pins 62 are erected upright on the base portion 61 in advance, there is no need to perform the work for placing the support pins on the base portion, which was necessary for the conventional back-up pin device. Accordingly, the efficiency of positioning work for positioning the back-up pin device 60 to the indicated position on the placing portion 41a of the back-up plate 41 can be highly improved. The man-hour for arrangement of the back-up pin device can be reduced, and thereby the mounting efficiency of the mounting component to the board can be greatly improved.

The base portion 61 made of a metal material such as stainless steel is formed to be of a rectangular plate shape. This can lower the center of gravity of the back-up pin device 60 and accordingly, the back-up pin device 60 can be stably arranged on the placing portion 41a of the back-up plate 41. The support pin 62 made of an elastic material such as urethane foam is formed to be of a pointed end columnar shape and is adhered to the upper surface of the base portion 61. It is noted that the support pin 62 formed to be of a pointed end columnar shape may be made of a metal material such as stainless steel.

Since the support pin 62 is made of an elastic material, the difference in height from the floor between the lower surface of the board and the lower surface of the already mounted component can be absorbed by the compression of the support pin 62 caused by the already mounted component, even when the back-up pin device 60 has to be placed at a position where the support pin 62 cannot avoid the already mounted component mounted on the under surface of the board. Thus the back-up pin device 60 can hold the board to the horizontal condition with a high degree of accuracy. The back-up pin device 60 having the support pin 62 made of an elastic material can support the boards of various types due to elasticity thereof and accordingly, can improve the freedom of design choice for positioning the back-up pin device 60 compared with the case of using the back-up pin device 60 having the support pin 62 made of a metal material. The back-up pin device 60 is capable of holding boards of further various types by preparing the back-up pin devices 60 in which a randomly selected number of support pins 62 are erected upright on the upper surfaces of the base portions 61.

The slide preventing member 63 is made of a cohesive material such as silicon resin, and adhered to a lower surface of the base portion 61 that is a placing surface to be adhered to the placing portion 41a of the back-up plate 41. The slide preventing member 63 can prevent a positional off-set of the back-up pin device 60 when the back-up pin device 60 is placed on the placing portion 41a, thereby to keep high positioning accuracy of the back-up pin device 60 on the placing portion 41a of the back-up plate. Further, by providing a slide preventing sheet 43 made of a cohesive material such as silicon resin adhered to the placing portion 41a of the back-up plate 41, the slide preventing sheet 43 can prevent the positional off-set of the back-up pin device 60 even when the base portion 61 receives a horizontal force exerted due to the compression of the support pin 62 caused by the already mounted component mounted on the under surface of the board. Either the slide preventing member 63 or the slide preventing sheet 43 may be applied to achieve the effect of prevention of positional off-set of the back-up pin device 60.

The support column 64 made of a metal material such as stainless steel is formed to be of a columnar shape, the height of which is lower than the height of the support pin 62. The support column 64 is erected upright on the base portion 61 by engagement of the lower end with a hole 61a provided at a central portion of the base portion 61. Thus, since the support column 64 is erected upright on the base portion 61, the back-up pin device 60 is sucked and picked up by an existing component suction nozzle 26 at the upper portion of the support column 64. Accordingly, there is no need to prepare a special purpose suction nozzle for picking up the back-up pin device 60 thereby to simplify the structure of the back-up pin placing device 70 which picks up and places the indicated back-up pin device 60 to the indicated position. Further, since the support column 64 is so formed that the height thereof is lower than the height of the support pin 62, even if the support pin 62 is compressed by the already mounted component mounted on the under surface of the board, the contact of the support column 64 with the board or the already mounted component can be avoided. Thus, the back-up pin device 60 can hold the board to be in horizontal state with the support pins 62 without contact of the support column 64 with the board.

The identification mark 65 and the position mark 66 are formed by stamping or printing so that the upper end surface of the support column 64 may be kept flat. Accordingly, the suction force applied to the upper end surface of the support column 64 is not impaired. The identification mark 65 is used for identifying the type of back-up pin device 60, for example, the size of the base portion 61, the number of support pins or the height thereof and is shown with alphabet letters, numerals or the combination thereof. The position mark 66 is used as a reference mark for positioning of the base portion 61 to the placing portion 41a of the back-up plate 41, which is shown with symbols, such as plus (+) or minus (−). That is to say, the position mark 66 is used as the reference for such as the placing position or the placing direction, particularly when a plurality of support pins 62 are erected upright on the base portion 61. The placing position is represented by the X-Y coordinate on the placing portion 41a of the back-up plate 41 and accordingly, the position of the base portion 61 is determined by placing the base portion 61 on the placing portion 41a at the position where the position of the coordinate agrees with the intersection of the mark (+). The placing direction is represented by, for example, an angle from the X-axis in a clockwise direction at a placing position and accordingly, the placing direction is determined by placing the base portion 61 on the placing portion 41a so that the mark (−) directs to the line indicating the angle from the X-axis.

Thus, since the identification mark 65 and the position mark 66 are provided on the upper end of the support column 64, it would be less affected by the support pin 62 when taking images of the marks 65 and 66 compared to the case where the marks 65 and 66 are provided at the base portion 61 near the root portion of the support pins 62. In other words, it can be prevented that the images of the respective marks 65 and 66 become unclear due to the shadows of the support pins 62. Accordingly, the images of the respective marks 65 and 66 can be highly accurately taken and processed so that the respective marks 65 and 66 can be surely identified. Thus, the back-up pin device 60 can be accurately placed on the placing portion 41*a* of the back-up plate 41.

Figure 6:
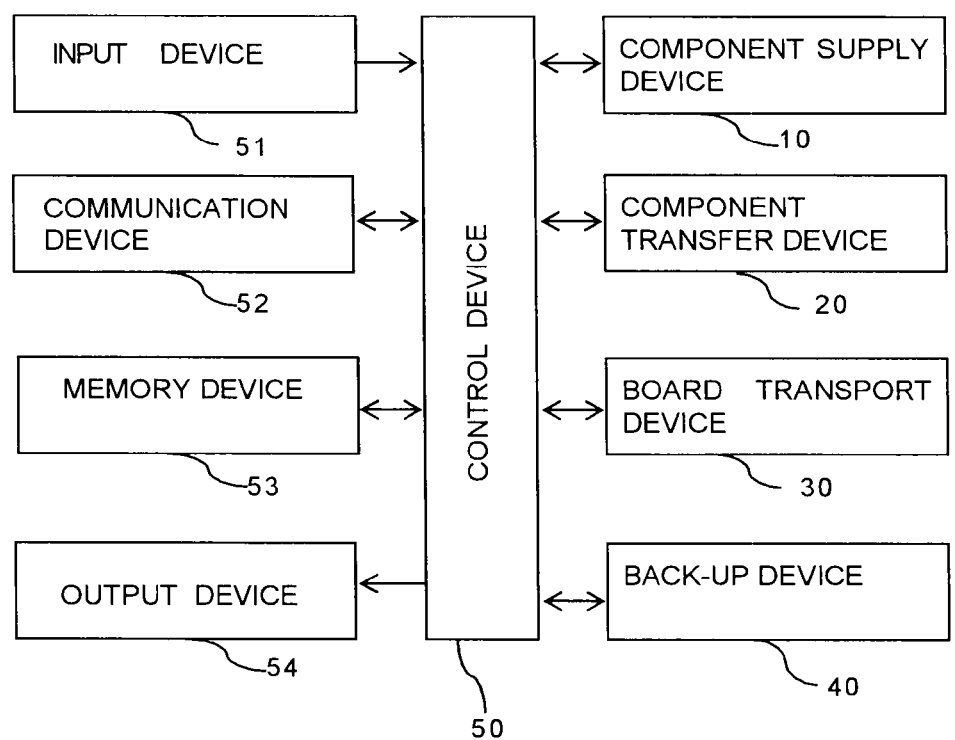
FIG. 6 is a schematic view showing a control device of the component mounting apparatus in FIG. 1.

As shown in FIG. 6, the control device 50 is provided with a microcomputer (not shown). The microcomputer is provided with input/output interfaces connected with each other through buses, CPU, RAM and ROM (all are not shown). Connected to the control device 50 are an input device 51, a communication device 52, a memory device 53, an output device 54, a component supply device 10, the component transfer device 20, the board transport device 30 and the back-up device 40.

The input device 51 is provided with a starter switch for starting operation of the component mounting apparatus 1 and a stopper switch for stopping the operation thereof. The communication device 52 is connected to a host computer via LAN (not shown) for sending and receiving signals. The memory device 53 memorizes a system program for controlling the entire system of the component mounting apparatus 1 as a whole, a control program for controlling individual elements of the component mounting apparatus 1 under the system program and a production program outputted from the host computer. The output device 54 outputs state information of the component mounting apparatus 1 and warning signals, etc.

In the component mounting apparatus 1 thus structured, the placing operation of the indicated back-up pin device 60 to an indicated position by the back-up pin placing device 70 will be explained hereinafter. It should be noted here that operator prepares the back-up pin devices 60 of a plurality types and places them in parallel on respective predetermined positions on the stocker 41*b* of the back-up plate 41 in advance of starting operation.

The control device 50 drives the Y-axis and X-axis sliders 22Y and 22X to move the component mounting head 24 on the stocker 41*b* and controls the board image taking camera 27 to take the images of identification marks 65 and position marks 66 of the respective back-up pin devices 60 which are placed in parallel on the predetermined position of the stocker 41*b*. Further, the control device 50 processes the images of the identification marks 65 and the position marks 66 which have been taken by the camera 27 to recognizes the respective types of the back-up pin devices 60 or the references for positioning corresponding to the positions on the stocker 41*b*. The control device 50 obtains from the host computer and memorizes the information on the type of back-up pin device 60 necessary for supporting the board, to which the component is to be mounted, and the information on the placing position thereof on the placing portion 41*a* of the back-up plate 41.

The control device 50 selects an indicated back-up pin device 60 among the recognized back-up pin devices 60 and specifies the position of the selected back-up pin device 60 relative to the stocker 41*b* based on the information on the type of the memorized back-up pin device 60 and the recognized identification marks 65 of the back-up pin devices 60. Then the control device 50 drives the Y-axis and X-axis sliders 22Y and 22X to move the component mounting head 24 to the specified position on the stocker 41*b*. Then, the control device 50 controls the first nozzle holder portion 261 to move downwardly in a Z-axis direction and controls sucking of the component suction nozzle 26 to pick up the selected back-up pin device 60 from the stocker 41*b*. The back-up pin device 60 is picked up by the upward movement of the first nozzle holder portion 261 in the Z-axis direction not to generate any off-set of the position mark 66 of the back-up pin device 60.

The control device 50 specifies the placing position of the picked up back-up pin device 60 on the placing portion 41*a* based on the information on the memorized placing position of the back-up pin device 60. Then, the control device 50 drives the Y-axis and X-axis sliders 22Y and 22X to move the component mounting head 24 to the specified position on the placing portion 41*a* of the back-up plate 41 and when necessary, controls the rotation of the first nozzle holder portion 261 to rotate the back-up pin device 60 sucked to the component suction nozzle 26 with a predetermined angle about a Z-axis based on the information on the recognized position mark 66 of the back-up pin device 60. Then the control device 50 drives the first nozzle holder portion 261 to move downwardly in the Z-axis direction thereby placing the back-up pin device 60 sucked to the component suction nozzle 26 so that the recognized position mark 66 of the back-up pin device 60 agrees with the specified position on the placing portion 41*a*. By executing this operation to all back-up pin devices 60 necessary for the board on which the components are to be mounted, the placing operation of the back-up pin devices 60 by the back-up pin placing device 70 finishes.

Figure 7:
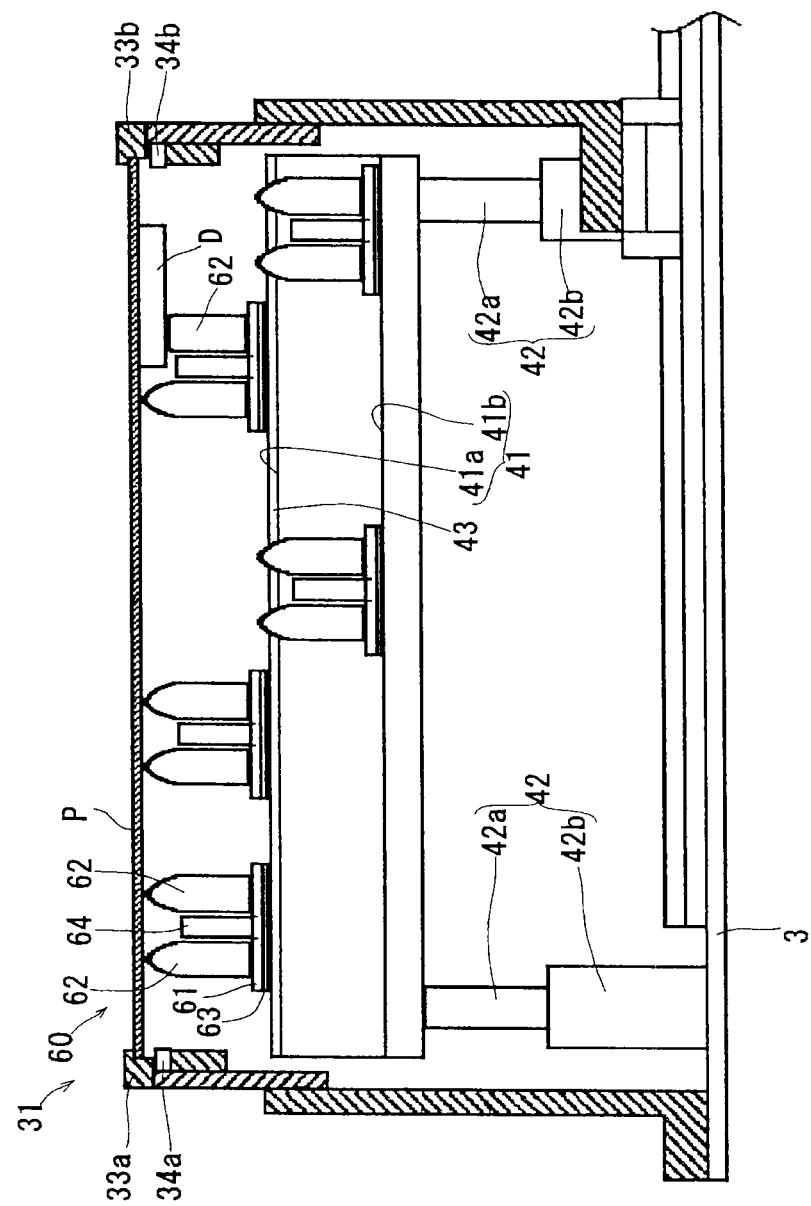
FIG. 7 is an explanatory view explaining an operation of the back-up device in FIG. 3.

Thereafter, as shown in FIG. 7, the control device 50 drives the transport device 31 to transport the board P to which the component is to be mounted to the mounting position of the component mounting apparatus 1 and drives the lifting and lowering device 42 to lift the back-up plate 41 on which the back-up pin devices 60 have been placed. Then, the board P is pushed up from the conveyer belts 34*a* and 34*b* by the back-up pin devices 60 placed on the placing portions 41*a* of the back-up plate 41 and is pressed to the pressing portions formed to project inwardly at the upper end of the guide rails 33*a* and 33*b* so as to be positioned and fixed.

When the support pins 62 of the back-up pin device 60 are formed by an elastic material, the difference in height from the floor between the lower surface of the board P and the lower surface of the already mounted component D can be absorbed by the compression of the support pin 62 caused by the already mounted component, even when the back-up pin device 60 has to be placed at a position where the support pin 62 cannot avoid the already mounted component mounted on the under surface of the board. Thus the back-up pin device 60 can hold the board P to the horizontal condition with a high degree of accuracy.

The control device 50 drives the Y-axis slider 22Y and the X-axis slider 22X to move the component mounting head 24 on the component supply portion 14 of the feeder 11 and drives the first nozzle holder portion 261 to move downward in a Z-axis direction and controls the component suction nozzle 26 to suck and pick up a component. Then, the control device 50 drives the Y-axis slider 22Y and the X-axis slider 22X to move the component mounting head 24 on the component image taking camera 28 and controls the camera 28 to take an image of the component which has been picked up.

Then, the control device 50, when necessary, drives the Y-axis slider 22Y and the X-axis slider 22X and the first nozzle holder portion 261 to compensate a possible position error or off-set of the component in Y-axis and X-axis directions as well as rotational error of the component about Z-axis relative to the component suction nozzle 26 based on the recognized component posture obtained by processing the image of the component taken by the camera 28. Then, the control device 50 drives the Y-axis slider 22Y and the X-axis slider 22X to move the component mounting head 24 on the board and drives the first nozzle holder portion 261 to move downward in a Z-axis direction to mount the component sucked by the component suction nozzle to a predetermined position on the board. After completing the mounting of all components, the control device 50 drives the transport device 31 to transport the board to which components are to be mounted to the next mounting position of the component mounting apparatus 1 and executes the component mounting operation.

According to the embodiment, the base portion 61 is made of a metal material and the center of gravity of the back-up pin device 60 can be lowered to be able to place the back-up pin device 60 on the back-up plate 41 in a stable manner. In addition, since the support pin 62 is made of an elastic material and adhered to the base portion, the difference in height from the floor between the lower surface of the board and the lower surface of the already mounted component can be absorbed by the compression of the support pin 62 caused by the already mounted component, even when the back-up pin device 60 has to be placed at a position on the placing portion 41*a* where the support pin 62 cannot avoid the already mounted component mounted on the under surface of the board. Thus the back-up pin device 60 can hold the board to the horizontal condition with a high degree of accuracy. This can improve the freedom of design choice for positioning the back-up pin device 60. Accordingly, the efficiency of positioning work for the back-up pin device 60 can be highly improved and mounting efficiency of the mounting component to the board can be greatly improved.

Further according to the embodiment, since a plurality of support pins 62 are erected upright on the base portion 61, the back-up pin device 60 can be highly efficiently placed to the indicated position on the placing portion 41*a* of the back-up plate 41.

According to the embodiment, since the support column 64 is provided on the base portion 61 and the height of the support column is lower than the height of the support pin, the back-up pin device 60 can be picked up by an already existing component suction nozzle which holds the upper end of the support column 64 by suction. Accordingly, there is no need for preparing a special purpose suction nozzle for picking up the back-up pin device 60. This can simplify the structure of the back-up pin placing device 70 for placing the back-up pin device 60 to the indicated position on the placing portion 41*a* by picking up. Further, since the height of the support column 64 is set to be lower than the height of the support pin 62 so that the support column 64 may not be in contact with the board or the already mounted component when the support pin 62 holds the board. Thus the back-up pin device 60 can be held to be horizontal by the support pin 62 without generating interference between the board and the support column 64. This can improve the freedom of design choice for positioning the back-up pin device 60. Accordingly, the efficiency of positioning work for the back-up pin device 60 can be highly improved and mounting efficiency of the mounting component to the board can be greatly improved.

Still Further according to the embodiment, since the identification mark 65 and the position mark 66 are provided at the upper end of the support column 64, it would be less affected from the support pin 62 when taking an images of the marks 65 and 66 compared to the case where the marks are provided at the root portion near the support pin 62 on the base portion 61. Accordingly, images of the marks can be highly accurately taken and surely identified by image processing. Thus, the back-up pin device 60 can be accurately placed on the back-up plate 41 thereby improving placing work efficiency of the back-up pin device 60. Mounting efficiency of the mounting component to the board can be greatly improved.

According to the embodiment, since the stocker 41*b* is provided on the back-up plate 41, smaller size back-up pin placing device 70 can be realized. Further, since the distance between the placing portion of the back-up pin device on the back-up plate 41 and the stocker 41*b* is relatively short, efficiency of positioning work for the back-up pin device 60 can be highly improved and mounting efficiency of the mounting component to the board can be greatly improved.

In the above-mentioned embodiment of the invention, the identification mark 65 and the position mark 66 are provided on the base portion 61 of the back-up pin device 60. However, at least one of the identification mark 65 and the position mark 66 may be provided on the base portion 61. In stead of the position mark 66, for example, the corner portion of the base portion 61 can be used to determine the position where the base portion 61 is placed relative to the placing portion 41*a*. In For instance, in stead of the identification mark 65, the back-up pin devices 60 of different types may be placed on respective predetermined positions on the stocker 41*b*. The respective predetermined position can be work as the identification mark 65 to identify the type of the back-up pin device 60 placed thereon. In the above-mentioned embodiment of the invention, a back-up pin placing device 70 is so structured that a single component suction nozzle 26 is used for holding the back-up pin device 60 by suction. However, a back-up pin placing device 70 may be structured to be a rotary type in which a plurality of component suction nozzles are provided on a rotatable disc plate so that the back-up pin devices 60 can be more efficiently placed to the indicated position on the placing portion 41*a* of the back-up plate 41. Further, instead of providing the component suction nozzle, a separate clamping device can be provided for clamping and holding the back-up pin device 60.

In the embodiment, the back-up plate 41 is integrally provided with a placing portion 41*a* and a stocker 41*b* with a stepped relation. However, the back-up plate 41 may be formed to be of a planar shape and a planar shaped block smaller than the back-up plate 41 may be placed on the back-up plate 41 as the placing portion 41*a* and the vacant space of the back-up plate 41 may be used as the stocker 41*b*. Further, only the placing portion 41*a* may be provided on the back-up plate 41 and the stocker 41*b* may be formed separately being provided on a vacant space of the base frame 3.

In the embodiment explained above, the slide preventing member 63 is adhered to the placing surface of the base portion B1 of the back-up pin device 60, which is mounted on the placing portion 41*a* of the back-up plate 41 to prevent positional off-set of the back-up pin device 60 by the adhesion force. However, one of the base portion 61 and the placing portion 41*a* of the back-up plate 41 may be made of a magnet material and the other may be made of a magnetic material to prevent such off-set by the magnetic force.

In the embodiment explained above, the back-up pin devices 60 are manually taken out from a separately provided storage box and stocked on the stocker 41*b* of the back-up plate 41 in parallel with one another by a worker. However, the control device 50 may drives the component mounting head 24 or a separately provided suction head to automatically take out the back-up pin devices 60 from a separately provided storage box and automatically place the back-up pin devices 60 on the stocker 41*b* of the back-up plate 41 in parallel with one another.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A plurality of back-up pin devices of different types detachably placed to indicated positions on a back-up plate equipped to a component mounting apparatus to support a board from an under surface thereof, to which components have already been mounted, when other components are to be mounted on an upper surface of the board, the back-up pin device comprising:
   a base portion detachably placed on the back-up plate;
   at least one support pin adhered to and erected upright on the base portion in advance and supporting the board by contacting an upper end thereof with the under surface of the board, the number of the support pins being different depending on a type of the back-up pin device; and
   an identification mark provided on the base portion for identifying the type of the back-up pin device, an indicated back-up pin device being selected by the identification mark among the plurality of back-up pin devices of different types, being picked up and placed on the indicated position on the back-up plate specified based on information about the type of the indicated back-up pin device so as to let the support pins thereof avoid the already mounted components on the under surface of the board.

2. The plurality of back-up pin devices according to claim 1, wherein the base portion is made of a metal material and the support pin is made of an elastic material and adhered to the base portion.

3. The plurality of back-up pin devices according to claim 1, wherein a plurality of the support pins are erected upright on the base portion.

4. The plurality of back-up pin devices according to claim 1, wherein a support column for being picked up is provided on the base portion and the height of the support column is lower than the height of the support pin.

5. The plurality of back-up pin devices according to claim 4, wherein the identification mark or a position mark is provided on an upper end surface of the support column.

6. The plurality of back-up pin devices according to claim 1, wherein the indicated positions on the back-up plate are not fixedly set in common among the back-up pin devices of different types.

7. A back-up pin placing device for placing back-up pins on a back-up plate provided beneath a board to support the board from a lower surface thereof when components are mounted on an upper surface of the board by a component mounting apparatus, the placing device comprising:
   back-up pin devices of different types according to any one of claim 1 through 5;
   a stocker capable of placing the back-up pin devices of different types;
   an image taking means capable of taking an image of at least one of an identification mark and a position mark of the back-up pin device placed in the stocker;
   a pickup means capable of picking up the back-up pin device placed in the stocker or the back-up pin device placed on the back-up plate;
   a transport means capable of moving the pickup means between the stocker and the back-up plate;
   a memory means for memorizing the information on the image of the mark inputted from the image taking means and the information on the types of the back-up pin devices or the indicated positions of the indicated back-up pin devices on the back-up plate, which is necessary for supporting the board while the components are mounted on the board; and
   a control means for controlling the operation of the image taking means, the pickup means and the transport means, wherein
   the control means drives the transport means and the pickup means to pick up the indicated back-up pin device from the stocker and to detachably place the picked up back-up pin device to the indicated position on the back-up plate.

8. The back-up pin placing device according to claim 7, wherein the stocker is provided on the back-up plate.

* * * * *